United States Patent
Ganti et al.

(10) Patent No.: US 12,360,187 B2
(45) Date of Patent: Jul. 15, 2025

(54) ENERGY HARVESTING DECOUPLER FOR AN MAGNETIC RESONANCE IMAGING (MRI) SYSTEM

(71) Applicant: KONINKLIJKE PHILIPS N.V., Eindhoven (NL)

(72) Inventors: Aasrith Ganti, Gainsville, FL (US); Tracy Allyn Wynn, Gainsville, FL (US); Alan Leroy Holland, Gainsville, FL (US); George randall Duensing, Hamburg (DE)

(73) Assignee: Koninklijke Philips N.V., Eindhoven (NL)

( * ) Notice: Subject to any disclaimer, the term of this patent is extended or adjusted under 35 U.S.C. 154(b) by 196 days.

(21) Appl. No.: 18/029,925

(22) PCT Filed: Aug. 5, 2021

(86) PCT No.: PCT/EP2021/071866
§ 371 (c)(1),
(2) Date: Apr. 3, 2023

(87) PCT Pub. No.: WO2022/073672
PCT Pub. Date: Apr. 14, 2022

(65) Prior Publication Data
US 2023/0375647 A1 Nov. 23, 2023

Related U.S. Application Data

(60) Provisional application No. 63/087,939, filed on Oct. 6, 2020.

(51) Int. Cl.
*G01R 33/36* (2006.01)
*G01R 33/24* (2006.01)
*G01R 33/3415* (2006.01)

(52) U.S. Cl.
CPC ......... *G01R 33/3692* (2013.01); *G01R 33/24* (2013.01); *G01R 33/3415* (2013.01); *G01R 33/3657* (2013.01)

(58) Field of Classification Search
CPC G01R 33/3692; G01R 33/24; G01R 33/3415; G01R 33/3657
See application file for complete search history.

(56) References Cited

U.S. PATENT DOCUMENTS

| | | | |
|---|---|---|---|
| 6,414,488 B1 * | 7/2002 | Chmielewski | G01R 33/3657 324/322 |
| 6,512,374 B1 * | 1/2003 | Misic | G01R 33/3657 324/318 |

(Continued)

FOREIGN PATENT DOCUMENTS

EP 3623831 A1 3/2020

OTHER PUBLICATIONS

Ganti et al "A Novel Energy Harvesting Circuit for RF Surface Coils in the MRI System" IEEE Transactions on Biomedical Circuits and Systems, vol. 15 No. Aug. 4, 2021.

(Continued)

*Primary Examiner* — Reena Aurora

(57) ABSTRACT

An apparatus (10) includes: a radiofrequency (RF) coil (18); a detune circuit (38) operatively coupled to the RF coil, wherein the detune circuit includes a decoupling inductor (40) configured as a transmitter (TX) inductor; and a harvester (44) coupled to the decoupling inductor for harvesting energy from the decoupling inductor.

19 Claims, 6 Drawing Sheets

(56) References Cited

U.S. PATENT DOCUMENTS

| | | | |
|---|---|---|---|
| 2010/0060283 A1* | 3/2010 | Findeklee | G01R 33/345 |
| | | | 324/318 |
| 2017/0160356 A1 | 6/2017 | Liu | |
| 2019/0265317 A1 | 8/2019 | Ortiz et al. | |
| 2020/0049777 A1 | 2/2020 | Fuderer et al. | |
| 2020/0096583 A1 | 3/2020 | Findeklee et al. | |

OTHER PUBLICATIONS

Riffe et al "Power Scavaging Cirucit for Wireless De Power" Proceedings of the Int. Soc. for Magnetic Reson. in Med, May 5, 2007.

International Search Report and Written Opinion From PCT/EP2021/071866 Mailed Nov. 25, 2021.

* cited by examiner

ENERGY HARVESTING DECOUPLER FOR AN MAGNETIC RESONANCE IMAGING (MRI) SYSTEM

CROSS REFERENCE TO RELATED APPLICATIONS

This application is a U.S. national phase application of International Application No. PCT/EP2021/071866 filed on Aug. 5, 2021, which claims the benefit of U.S. Provisional Application Ser. No. 63/087,939 filed on Oct. 6, 2020 and is incorporated herein by reference.

FIELD

The following relates generally to the magnetic resonance (MR) imaging arts, MR coil arts, MR signal processing arts, MR energy harvesting arts, and related arts.

BACKGROUND

Magnetic resonance (MR) imaging entails placing a subject (e.g., medical patient, veterinary subject, archaeological mummy, et cetera) in a static magnetic field (often referred to as a $B_0$ field) and exciting nuclear magnetic resonance in the subject and then detecting the excited magnetic resonance. For imaging, the excited MR is spatially encoded with respect to location, phase, and/or frequency by superimposing magnetic field gradients on the static $B_0$ magnetic field during the excitation, during a time interval between MR excitation and MR readout, and/or during the MR readout. In a typical design, the MR imaging device (sometimes referred to as an MRI scanner) includes a housing with a central bore within which the MR examination region is located. The static $B_0$ magnetic field is produced by solenoidal magnet windings wrapped around the central bore and housed within the MRI scanner housing. These solenoidal magnet windings are often superconducting windings in modern MRI scanners, and the housing includes a liquid helium (LHe) reservoir cooling the superconducting windings. Magnetic field gradient coils are also disposed in the housing around the central bore.

In addition, surface MR coils or other types of local MR coils are often used to acquire imaging data. A surface coil can be laid onto and/or underneath the anatomy to be imaged to provide close electromagnetic coupling between the surface coil and the anatomy enabling acquisition of high-quality MR images. Other types of surface or other local coils include had coils that are fitted onto the head for brain imaging, limb coils that are placed around a limb to be imaged, or so forth. To even further improve image quality, a large arrays of surface coils can be used in the MRI system. Large surface coil arrays reduce the time required by clinicians for obtaining high-quality images. However, with the addition of surface arrays in the current way of working, multiple cables need to be added to connect the surface coil arrays to the MRI system galvanically. Each channel of a fully hardwired radiofrequency (RF) surface coil utilizes at least one RF cable and two digital current (DC) cables to route power and signals. With increasing channel counts, this can become very bulky and unyielding. Not only are these large cable bundles challenging to manage, but they also may cause patient harm when placed close to the patient due to induced eddy currents and consequent heating. The amount of cabling can be reduced by replacing the signal cabling with a wireless radio transmitter. To eliminate the power cabling, the MR surface coil could incorporate a battery that is recharged at an external charging station. However, the requisite battery may be undesirably large if the local coil is used in long imaging sessions and draws significant electrical power. Another approach is to design the local RF coil to harvest electrical power from the RF excitation transmit field generated by the MRI scanner. This approach facilitates using a smaller battery, or even a storage capacitor, since power can be harvested during the MR imaging session. However, effective energy harvesting presents substantial challenges.

The following discloses certain improvements to overcome these problems and others.

SUMMARY

In some embodiments disclosed herein, an apparatus includes: a radiofrequency (RF) coil, a detune circuit operatively coupled to the RF coil, wherein the detune circuit includes a decoupling inductor configured as a transmitter (TX) inductor; and a harvester coupled to the decoupling inductor for harvesting energy from the decoupling inductor.

In some embodiments disclosed herein, a method of harvesting energy from a magnetic resonance (MR) imaging device includes coupling a detune circuit to a RF coil; coupling a harvesting inductor of a harvester with a decoupling inductor of the detune circuit; and harvesting energy with the decoupling inductor.

In some embodiments disclosed herein, an apparatus includes: a RF coil; a detune circuit operatively coupled to the RF coil, wherein the detune circuit includes a decoupling inductor configured as a TX inductor; and a harvester coupled to the decoupling inductor for harvesting energy from the decoupling inductor, the harvester further including a harvester capacitor having a capacitance value and a harvesting inductor. The harvesting inductor and the decoupling inductor operate as a transformer to harvest the energy from the harvester capacitor.

One advantage resides in providing an improved energy harvesting circuit for an RF surface coil or other wireless electronic device used in an MR bore during MRI imaging.

Another advantage resides in reducing or eliminating a need for cables connecting to an RF surface coil.

Another advantage resides in harvesting energy from an MRI system's RF transmit field in a manner that reduces or eliminates the potential for the energy harvesting circuit to introduce image distortion.

Another advantage resides in providing a local MR coil with an energy harvesting circuit that is galvanically isolated from the MR coil loop used for receiving the MR signal.

Another advantage resides in providing an energy harvesting circuit having a tunable balance between the amount of energy harvested and a load impedance placed on the MR coil loop used for receiving the MR signal.

Another advantage reside in providing an energy harvesting circuit that additionally provides an estimate of the $B_1$ field at the local MR coil.

A given embodiment may provide none, one, two, more, or all of the foregoing advantages, and/or may provide other advantages as will become apparent to one of ordinary skill in the art upon reading and understanding the present disclosure.

BRIEF DESCRIPTION OF THE DRAWINGS

The disclosure may take form in various components and arrangements of components, and in various steps and arrangements of steps. The drawings are only for purposes of illustrating the preferred embodiments and are not to be construed as limiting the disclosure.

DETAILED DESCRIPTION

Figure 1:
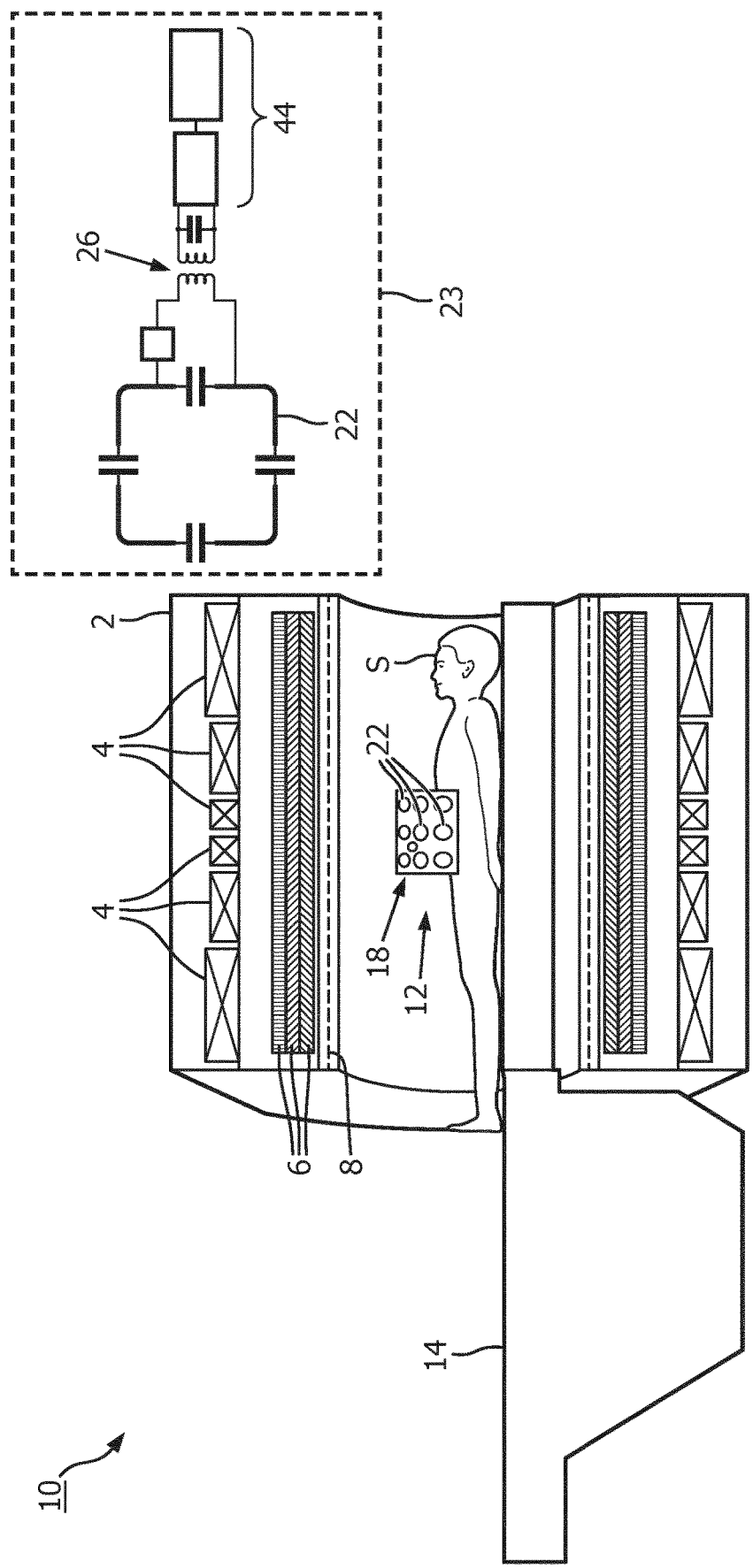
FIG. 1 diagrammatically illustrates a magnetic resonance (MR) imaging device including a local MR coil in accordance with the present disclosure.

To provide energy harvesting, some current MRI local coil designs include a decoupler circuit and an energy harvester galvanically connected to the coil loop used for receiving the MR signal. In such designs a physically large inductor is employed for providing a suitable impedance to achieve energy harvesting while the decoupler is working. Control of the circuit by a rectifier circuit is also complicated, with multiple components used for creating the appropriate impedance.

The following relates to an improved design of an energy harvesting circuit for a local MR coil (e.g., an illustrative MR surface coil, or a head coil, or so forth). As disclosed herein, the improved design includes a reduced number of inductors compared to current energy harvesting circuit designs. In the design disclosed herein, the harvesting circuit is not galvanically connected with the detuning circuit at all. Rather, a transformer comprising a detuning inductor and an added harvesting inductor provides solely magnetic coupling of the harvesting circuit to the detuning circuit. This avoids the possibility of the harvesting circuit introducing a low impedance bypass path.

Additionally, some embodiments of the disclosed energy harvesting circuit enable tuning of the balance between the energy harvesting and MR signal distortion potentially introduced by the harvester. In general, if the harvester presents a low load looking in from the decoupling capacitor, then a high fraction of the energy is harvested—but this can introduce MR signal distortion. On the other hand, if the harvester presents a high load, then this minimizes or eliminates MR signal distortion, but also provides a low fraction of energy harvested. In designs disclosed herein, the choice of capacitance for a capacitor of the disclosed energy harvesting circuit can tune the load and hence the harvesting/distortion balance. In some embodiments, the capacitor may be a digital capacitor that can be tuned electronically, so that this balance can be tuned for specific MR operational situations.

In some embodiments disclosed herein, the $B_1$ field can be estimated from energy harvested. To do so, the harvested energy is digitized using an analog-to-digital converter (ADC). For a given coil and setting of the capacitor of the energy harvester, this signal is measured for different a priori-known $B_1$ fields to generate a look-up table or fitted equation that is stored in the coil electronics. Thereafter, the look-up table or fitted equation can be used to estimate $B_1$ from the ADC-converted harvested energy. This advantageously provides a $B_1$ measurement at the coil itself, rather than at some $B_1$ sensor located elsewhere in the MRI bore.

The following relates to energy harvesting for a wireless MR coil. In this case, the surface coil loop used for receiving the MR signal is leveraged for the energy harvesting. However, the disclosed approaches can be used to power other wireless devices that might be used in an MR bore, such as a wireless patient monitor. In such cases, a patient monitor signal transmit antenna could similarly include a detuning circuit to protect the device during the transmit phase of the MR sequence, and the disclosed energy harvesting circuit could be analogously connected via a transformer with the inductor of the transmit antenna detuning circuit.

With reference to FIG. 1, an illustrative magnetic resonance (MR) imaging system or device 10 for imaging a subject S (e.g., an illustrative human subject S such as a medical patient, or a veterinary subject, or an archaeological mummy, et cetera) comprises a magnetic resonance (MR) imaging scanner (also referred to herein as an MRI scanner), which in the illustrative example includes a housing or gantry 2 containing various components shown in FIG. 1, such as by way of non-limiting illustrative example a superconducting or resistive magnet 4 generating a static ($B_0$) magnetic field, magnetic field gradient coils 6 for superimposing magnetic field gradients on the $B_0$ magnetic field, a whole-body radio frequency (RF) coil 8 for applying RF pulses to excite and/or spatially encode magnetic resonance in an imaging patient disposed in an MR bore 12 or other MR examination region, and/or so forth. The magnet 4 and the gradient coils 6 are arranged concentrically about the bore 12. A robotic patient couch 14 or other patient support enables loading a medical patient, a patient undergoing a medical screening, or other imaging patient into the MR bore 12 for imaging.

The magnetic resonance excited in the imaging subject S is read out by an MR receive coil 18 that, in the illustrative embodiment, includes a plurality of MR coil elements 22. (In the limit, the number of coil elements may be 1, that is, the coil may have only a single coil element). Each coil element 22 includes a radio frequency MR receive loop for receiving MR signals excited in a subject disposed in the MR imaging device 10. Each coil element 22 typically forms an MR receive channel.

FIG. 1 shows an illustrative MR coil 18 (or, alternatively, coil array 18) with a plurality of illustrative coil elements 22 (i.e. MR coil loops 22 used for receiving the MR signal). It will be appreciated that the coil 18 may in general include any number of coil elements 22, e.g., 16 coil elements, 20 coil elements, 32 coil elements, etc. Each coil element 22 is typically part of an MR receive channel that includes the MR coil loop 22 configured to receive MR signals in an MR frequency band and a pre-amplifier and often other signal processing electronics. Each illustrative coil loop 22 may be a single loop of copper, copper alloy, or another electrically conductive material, for example formed as a copper layer deposited on a circuit board, plastic sheet, plastic former, or other electrically insulating substrate; or alternatively formed as a freestanding metal loop. However, more generally the coil loop 22 for receiving the MR signal may be any suitable antenna capable of coupling with MR signals in the MR frequency band, e.g., a multiple-turn loop or otherwise-shaped antenna. In some examples, MR coil 18 including the MR coil element(s) 22 is configured to be disposed in the examination region (i.e., the MR bore 12), as shown in FIG. 1. While the illustrative local coil 18 is a surface coil, more generally the disclosed energy harvesting can be employed in conjunction with any type of local coil that is desirably constructed to be a wireless local coil.

With continuing reference to FIG. 1, an inset diagrammatically illustrates one MR coil receive channel 23 of the MR coil 18, including the coil loop 22 of the channel for receiving the MR signal, and an energy harvesting circuit 44 for extracting electrical power for operating the MR coil 18 from the $B_1$ field at the local MR coil. In the illustrative embodiment, the energy harvesting circuit 24 is not galvanically connected with the coil loop 22, but rather is magnetically connected by way of a transformer 26 as described herein.

Figure 2:
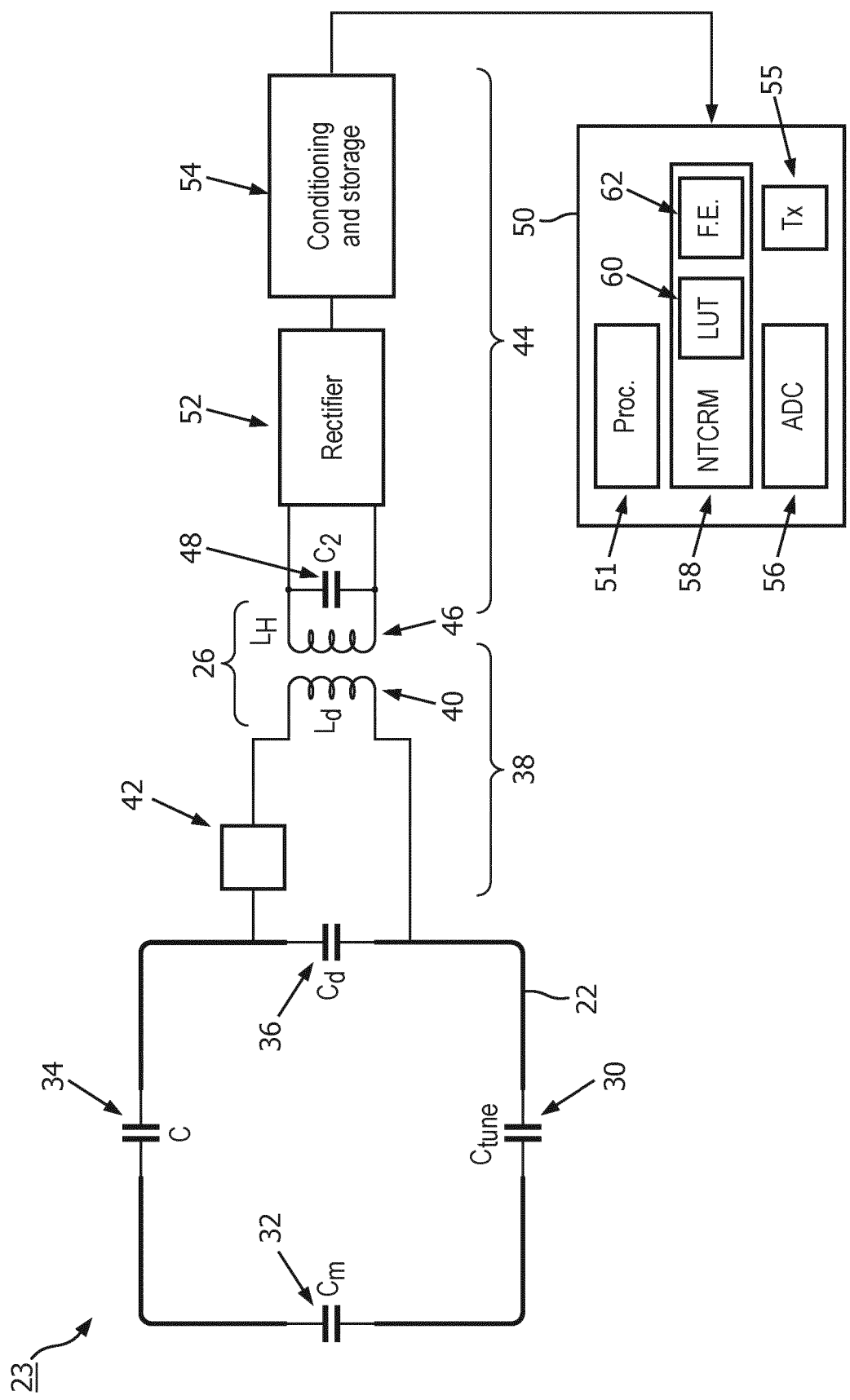
FIG. 2 shows a diagrammatic representation of one channel of the local MR coil array of the MR imaging device of FIG. 1.

FIG. 2 shows an enlarged view of the MR coil receive channel 23. As shown in FIG. 2, the MR coil loop 22 for receiving the MR signal includes a tuning capacitor $C_{tune}$ 30 configured to tune the RF surface coil 18, a second capacitor $C_m$ 32, a third capacitor C 34, and a decoupling capacitor $C_d$ 36. This is merely an illustrative design, and more generally the energy harvesting disclosed herein can be used with any type of MR receive coil loop.

The MR coil receive channel 23 further includes a detune circuit 38. The detune circuit 38 is operatively connected with the RF surface coil 18 via the decoupling capacitor $C_d$ 36. The detune circuit 38 includes a detuning or decoupling inductor $L_d$ 40 to form a detuning $L_d C_d$ circuit. As disclosed herein, to enable the energy harvesting the detuning or decoupling inductor $L_d$ 40 is also configured as a transmitter (Tx) inductor. The detune circuit 38 also includes a detuning diode z 42 that is switched off when the MR coil loop 22 is used for receiving an MR signal, and can be switched on during the RF excitation phase of the MR imaging device 10 to detune the MR coil loop 22 from the MR resonance frequency in order to protect the MR coil loop 22 from damage or from heating that could induce burns to the patient.

The MR coil receive channel 23 also includes a harvesting circuit or harvester 44 magnetically coupled to the decoupling inductor 40 for harvesting energy from the decoupling inductor 40. To do so, the harvester 44 includes a harvesting inductor 46 configured to operate with the decoupling inductor 40 to form a magnetic coupling of the harvesting circuit 44 to the detune circuit 38. That is, the harvesting inductor 46 and the decoupling inductor 40 cooperatively form the transformer 26 providing purely magnetic coupling of the harvester 44 to the MR coil loop 22. For example, the harvesting inductor 46 and the decoupling inductor 40 operate as the transformer 26 to harvest the energy from the $B_1$ field using the MR receive coil 22 during the transmit phase of an MR imaging sequence. As such, the harvester 44 is not galvanically connected with the detune circuit 38.

The harvester 44 also includes a harvester capacitor 48 having a capacitance value. In some embodiments, the harvester capacitor 48 is an electronically tunable capacitor whose capacitance value is tunable to tune a load impedance of the harvester 44.

The harvester 44 further includes a rectifier 52 having an impedance value $Z_{rec}$ which can be transferred to the harvesting inductor 46. The harvester 44 also includes a storage 54 for storing the harvested electrical energy. The storage 54 may be a battery or a storage capacitor, for example. Advantageously, since the harvester 44 can charge the storage 54 during a MR imaging session, the storage 54 can be of smaller electrical storage capacity, and hence of smaller physical size, compared with the battery of a wireless MR coil that must be recharged at an external charging station between MR imaging sessions. The harvested energy can be retrieved from the storage 54 to supply power to the RF coil 18. For example, coil electronics 50 including at least an electronic processor 51 and a radio transmitter or transceiver 55 may be powered by the storage 54 to provide for receiving the MR signal during the receive phase of the MR imaging sequence via the measurement capacitor $C_m$ 32 (connection not shown) and wirelessly transmitting the MR signal off the MR coil 18 using the radio transmitter or transceiver 55.

In some embodiments, the electronics 50 can be configured to estimate the $B_1$ magnetic field generated by the whole-body RF coil 8 during the MR transmit phase. To do so, the electronics 50 further includes an analog-to-digital (ADC) converter 56 configured to digitize the harvested energy to generate a digital harvested energy signal, and a non-transitory computer readable medium 58 storing instructions executable by the at least one electronic processor to estimate a magnetic field generated by the RF coil 18 from the digital harvested energy signal.

In some embodiments, the non-transitory computer readable medium 58 further stores a look-up table 60. The at least one electronic processor 50 is programmed to estimate the magnetic field generated by the RF coil 18 from the digital harvested energy signal by estimating the magnetic field from values in the look-up table 60. The look-up table 60 can be generated by determining a type of the RF coil 18 and the capacitance value of the harvester capacitor 48, measuring the digital harvested energy signal for different known magnetic fields to generate magnetic field values; and generating the look-up table 60 from the generated magnetic field values.

In other embodiments, the non-transitory computer readable medium 58 further stores a fitted equation 62. The at least one electronic processor 50 is programmed to estimate the magnetic field generated by the RF coil 18 from the digital harvested energy signal by estimating the magnetic field from the fitted equation 62. The fitted equation 62 can be generated by determining a type of the RF coil 18 and the capacitance value of the harvester capacitor 48, measuring the digital harvested energy signal for different known magnetic fields to generate magnetic field values; and generating the fitted equation 62 from the generated magnetic field values.

Figure 3:
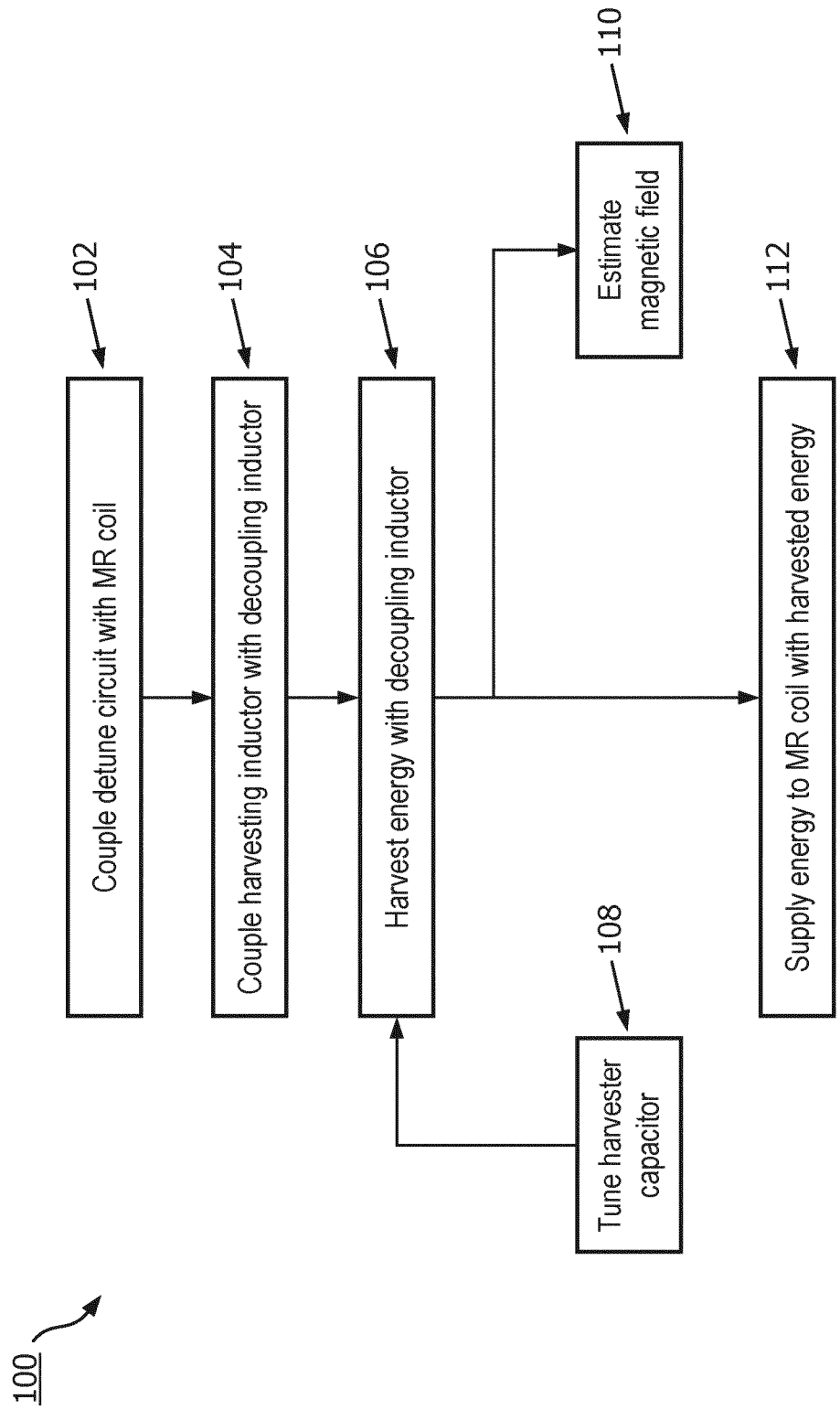
FIG. 3 diagrammatically illustrates an MRI energy harvesting method suitably performed by the energy harvesting circuit of the MR coil channel of FIG. 2.

With reference to FIG. 3, and with continuing reference to FIGS. 1 and 2, an illustrative MR method 100 using the MR device 10 is diagrammatically shown as a flowchart. To being the method 100, a patient is loaded onto the couch 14 and into the bore 12. The MR coil 18 is placed onto the patient. At an operation 102, the detune circuit 38 is coupled to the MR coil 18 via the decoupling capacitor $C_d$ 36. At an operation 104, the harvesting inductor 46 is coupled with the decoupling inductor 40. At an operation 106, energy is harvested with the decoupling inductor 40. For example, the energy can be harvested from the harvester capacitor 48. At an optional operation 108, a capacitance value of the harvester capacitor 48 can be electronically tuned to tune a load impedance of the harvester 44. For example, if the harvester capacitor $C_2$ 48 is an electronically tunable capacitor then the processor 51 can be programmed to adjust the capacitance value of the tunable capacitor 48 to set the load impedance. At another optional operation 110, the harvested energy can be digitized with the ADC converter 56 and used to estimate a magnetic field generated by the RF coil 18. The operation 100 can be performed with the look-up table 60 or the fitted equation 62. At an operation 112, the harvested energy is used to supply power to the RF coil 18. It should be noted that the MR method 100 shown in FIG. 3 depicts only operation during the RF excitation phase of the MR imaging sequence. During the MR read phase, the operation 102 is reversed by opening the detuning diode z 42 to disengage the decoupler 38 and the coil loop 22 is used to acquire the MR signal which is transmitted off the coil 18 by the transmitter or transceiver 55 (see FIG. 2).

EXAMPLE

The following is a further example of a method to harvest energy from the MRI system. The energy harvester 44 is coupled to or attached to the decoupler circuit 38 to save space and reduce space within the surface coil.

A method to harvest energy is proposed wherein the decoupling inductor 40 acts as the TX inductor, and a harvester 44 is coupled onto the decoupling inductor 40. By this process, as higher energy is harvested, the decoupling impedance decreases. A balance can be maintained depending on the $B_1$ image quality for the surface coil 18. The energy harvested is controlled by changing the secondary harvesting capacitor 48 that not only controls the impedance of the decoupler circuit but also controls the energy harvested.

There is a requirement for large arrays of surface coils 18 for use in the MRI system 10. Large surface coil arrays reduce the time required by clinicians for obtaining high-quality images. However, with the addition of surface arrays in the current way of working, multiple cables need to be added to connect the surface coil arrays to the MRI system galvanically. Each channel of an RF surface coil utilizes at least one RF cable and two DC cables to route power and signals. With increasing channel counts, this can become very bulky and unyielding. Not only are these large cable bundles challenging to manage, but they also may cause patient harm when placed close to the patient. By utilizing energy harvesting, the need for cables outside the surface coil can be eliminated entirely. In this case, the energy can be harvested from the MRI system's RF transmit field. There are several ways to implement wireless power, but harvesting minimizes the space consumed by the electronics inside the MRI system.

Referring back to FIG. 2, the harvester circuit 44 harvests energy from the decoupling inductor $L_d$ 40. The harvest inductor ($L_H$) 46 couples to the decoupling inductor 40. A capacitor on the secondary $C_2$ 48 controls the impedance reflected back onto the decoupler 38. A higher capacitance would imply a lower impedance being reflected back to the decoupler 38 and thus lower energy harvesting. However, a lower value of $C_2$ 48 implies higher impedance being reflected and a higher amount of energy harvested. The inductors should preferably have or be built in a way that the coefficient of coupling remains mid-range. A very low coupling implies little or no energy transfer, while a high rate of coupling will imply most or all the energy harvested.

Referring to FIG. 1, three elements are shown: a) a surface coil 18; b) a decoupler circuit 38; and c) a harvester 44.

The RF surface coil 18 may be a loop of copper used to obtain signals from the human body after the MRI excitation pulse. As the signal decays with distance, it is placed as close as possible to the volume of interest. As the surface coil 18 is tuned to the same frequency as the MRI system 10, a large current will be developed during the transmit portion of the MRI system. This current can cause not only image distortions but also cause patient harm in the form of RF burns. To prevent this from happening, circuits called decoupler circuits are used to reduce the currents induced in the surface coil during MRI transmit. The decoupler circuit 38 is typically an LC tank circuit and stores energy. When the surface coil 18 is switched into the RX mode, the decoupler 38 is turned OFF, and the energy stored in the decoupler circuit 38 is released as heat from the inductor and the switch.

The energy lost as heat can be harvested and used to power the RF surface coil 18. The harvester 44 has an inductor 46 to couple into the decoupler circuit 38 and pick up energy. The energy harvested is then sent to a rectification circuit 52 and finally a load. A load can either be a battery or supercapacitor or other power conditioning devices like DC converters or PMUs.

However, care should be taken as harvesting energy reduces the decoupling impedance offered to the surface coil 18. Therefore, it is desirable to control the amount of energy harvested for maintaining the minimum impedance required for the RF surface coil 18. Two main aspects can achieve this control:

a) Coupling between the decoupler 38 and harvester 44 and b) Secondary compensation capacitor $C_2$ 48.

Figure 4:
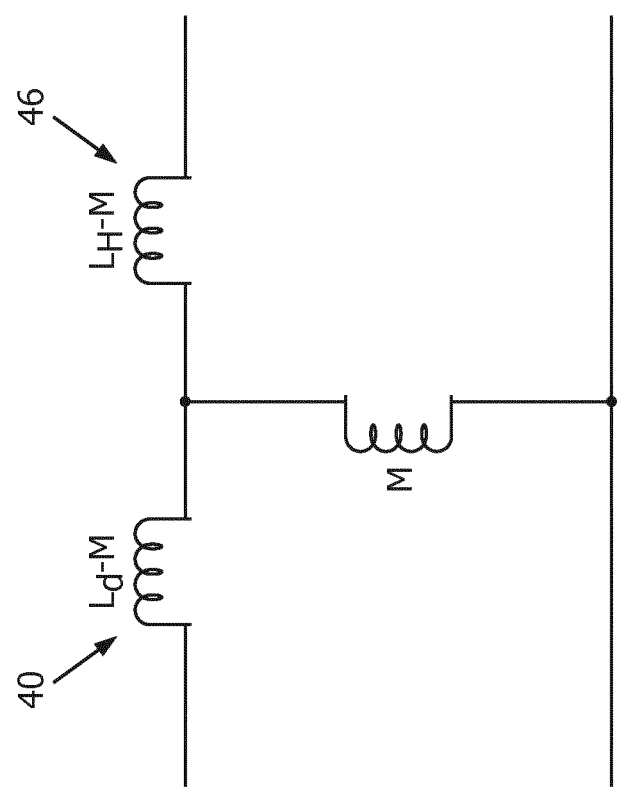
FIG. 4 illustrates an equivalent circuit of the transformer coupling of the energy harvesting circuit to the MR coil loop used for receiving the MR signal in the local MR coil of FIG. 2.

The coupling between the decoupler 38 and harvester 44 are controlled by constructing inductive structures such that they resonate the decoupling capacitance but also couple to transfer the energy via magnetic coupling. It needs to be ensured that the coupling between the decoupler 38 and harvester 44 is not too low and, at the same time, not too high. The coupling required can be determined by measuring the impedance of the whole circuit. As the coefficient of coupling changes, this impedance changes. FIG. 4 shows an equivalent circuit of the transformer 26. In this equivalent circuit, M represents the mutual inductance between the coupled inductors $L_d$ and $L_H$. As seen in FIG. 4, when the coupling is low, the impedance is low no energy is harvested, and as is the case with very high coupling. This ideal coupling value is determined based on the components chosen for building the decoupler circuit.

When the secondary inductor couples into the primary, there is a loss in inductance due to the mutual coupling. This loss in inductance should be addressed, and inductor values greater than the value typically picked for resonance need to be picked. Since the harvester's inductance couples into the primary, it reduces the inductance. Therefore, the inductor values are chosen in such a way that the combination of them resonate the decoupling capacitor 38 according to Equation 1.

$$Z_{in} = \cfrac{1}{\cfrac{1}{(R_1 + j\omega L_d) + \cfrac{\omega^2 M^2}{(Z_{Load} + (R_2 + jL_H\omega)(1 + jR_L C_2\omega))}} + jC_d\omega} \quad (1)$$

The capacitor $C_2$ 48 is the compensation capacitor. By controlling this capacitance the impedance of the harvester 44 reflected onto the decoupler circuit 38 can be controlled. A lower value of capacitance reflects a high impedance whereas a higher value of capacitance reflects a lower value. Under this scenario, a high impedance of the decoupler 38 is achieved and no energy harvesting takes place. Though for proof of concept, this compensation capacitor 48 is made to be of fixed value, a digitally controlled capacitor can vary the amount of energy harvested as needed.

An embodiment of the MR channel 23 was built and tested in the MRI system 10. B1 distortion studies, SNR studies and load analysis was performed in the system 10. From the experiments it was revealed that the energy harvesting decoupler circuit 38 does not cause B1 distortions that would cause patient harm or cause a distortion high enough to spoil the diagnostic image. Secondly, the SNR of the image obtained by performing this test seemed to be acceptable with a small lowering in SNR that can be optimized in future applications. Finally, upon conducting a load analysis very interesting results were achieved.

The highest power harvest was achieved at lower load values. This would represent a case when the system is demanding a great amount of power or when the energy storage element is out of power. At higher load values as in the non-operational case, a requirement for power does not exist and therefore lower power is harvested. This can be thought of as the trickle charge state. This is also a very useful feature as it represents a decoupling methodology in case something happens to the harvester 44. If the harvester is damaged the decoupler circuit 38 remains at high impedance and the patient remains safe. No energy harvesting takes place keeping the device safe.

Figure 5:
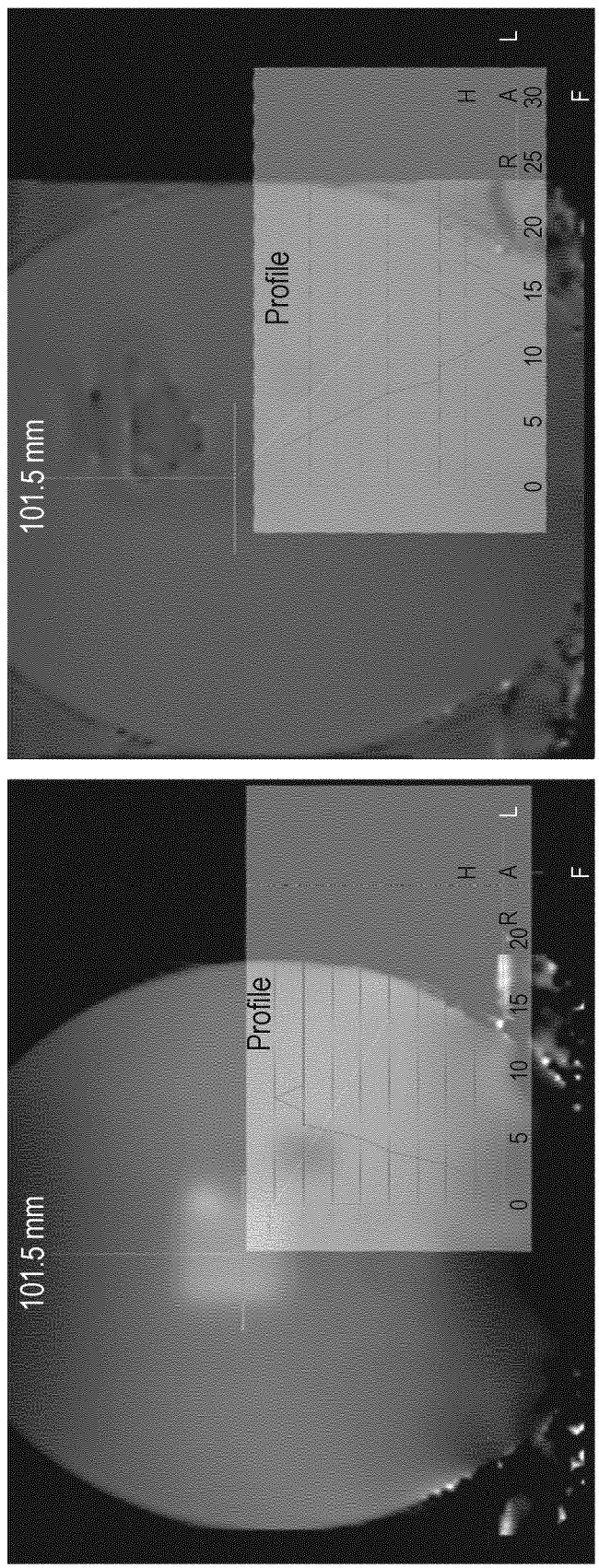
FIG. 5 shows B1 distortion data for a conventional surface coil (left image) and for a surface coil including a transformer-coupled harvesting circuit (right image).

The B1 distortion resulting from a surface coil channel without (left image) and with (right image) the energy harvester 44 are shown in FIG. 5. A low value load was connected at the output to make sure highest amount of energy is harvested while making the measurement. The B1 distortion for the traditional decoupler is 7.69% and the distortion with the energy harvesting decoupler is 9.18%. This is below the required 10% distortion for both image quality and safety of the surface coil. This can be further lowered if desired by adjusting the circuit element values, e.g., by adjusting $C_2$ as discussed.

Figure 6:
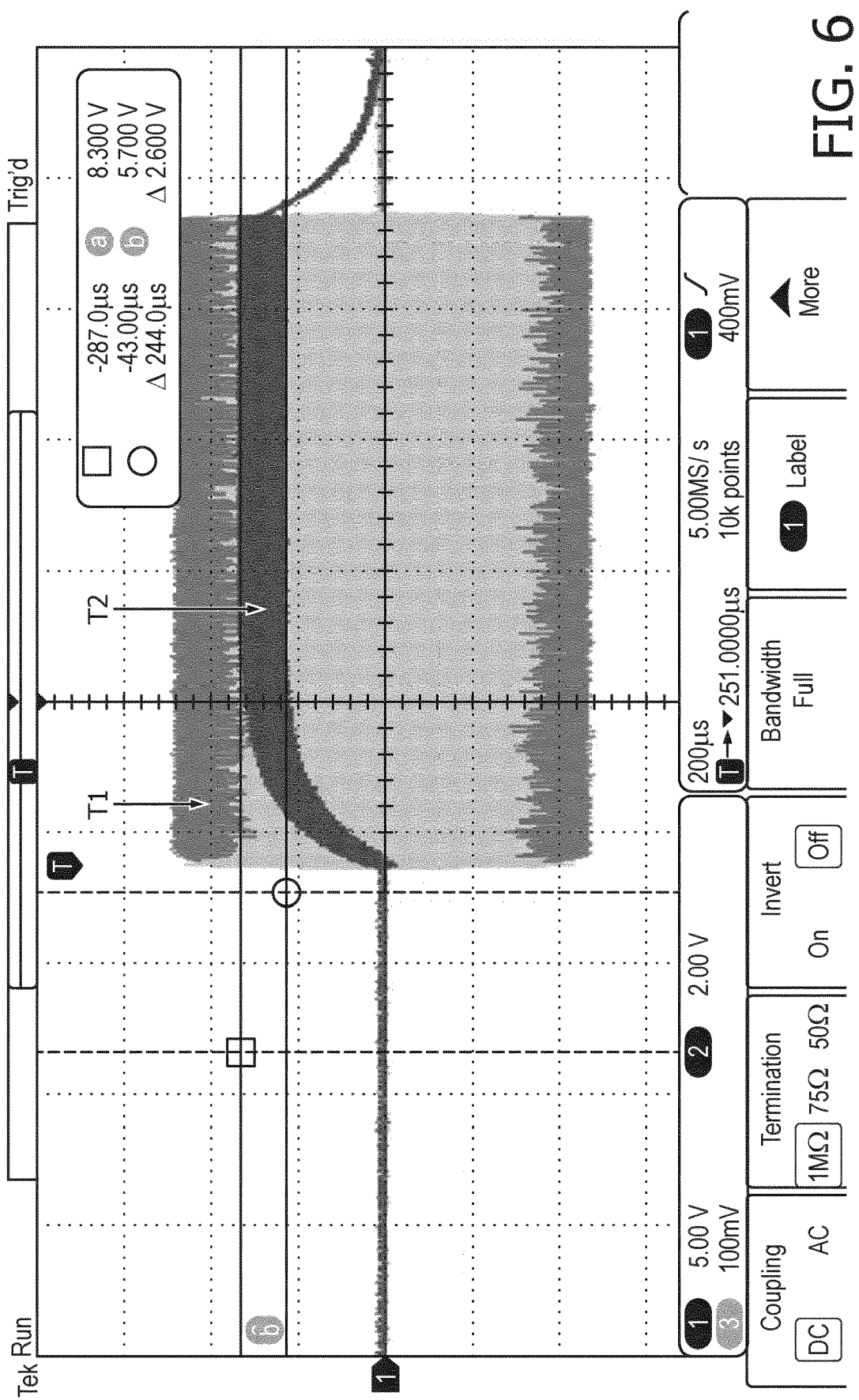
FIG. 6 shows voltage harvested from an energy harvesting decoupler circuit employing a transformer coupling as shown in FIG. 2.

FIG. 6 shows the voltage harvested from the energy harvesting decoupler circuit 38. The trace T1 represents transmit pulse of the MRI system measured using a quadrature probe. The trace T2 represents the output of the energy harvesting decoupling circuit 38. The power output from the circuit is calculated by using the measured voltage.

A power management unit connected to the energy harvesting circuit can be used to manage the power distribution within the surface coil. The PMU can also be responsible for collecting power from decouplers from adjacent surface coil and adding them for obtaining a greater power. The PMU will also be responsible for powering the coils appropriately during the transmit and receive portions of the MRI system.

Furthermore, an ADC 56 connected to the output of the energy harvest circuit functions to detect the localized incident B1 field. This information can be used to make smarter RF surface coils and better B1 field detectors. Currently, the B1 field is measured from field probes placed at predetermined locations in the MRI system and is used to determine characteristics like SAR. However, localized B1 detection will not only lead to algorithms to improve SNR but also provide a more accurate readings for calculating localized SAR. As SAR is a safety requirement it will be a great advancement than the current state of art.

The disclosure has been described with reference to the preferred embodiments. Modifications and alterations may occur to others upon reading and understanding the preceding detailed description. It is intended that the exemplary embodiment be construed as including all such modifications and alterations insofar as they come within the scope of the appended claims or the equivalents thereof.

The invention claimed is:

1. An apparatus, for use in harvesting energy from a magnetic resonance (MR) imaging device, comprising:
   a radiofrequency (RF) coil;
   a detune circuit operatively coupled to the RF coil, wherein the detune circuit includes a decoupling inductor configured as a transmitter (TX) inductor; and
   a harvester magnetically coupled to the decoupling inductor for harvesting energy from the decoupling inductor an analog-to-digital (ADC) converter configured to digitize the harvested energy to generate a digital harvested energy signal;
   at least one electronic processor; and
   a non-transitory computer readable medium storing instructions executable by the at least one electronic processor, the instructions causing the at least one-processor to apply the digital harvested energy signal to at least one of a look-up table and a fitted equation to estimate a magnetic field generated by the RF coil.

2. The apparatus of claim 1, wherein the harvester comprises:
   a harvesting inductor configured to operate with the decoupling inductor to form a magnetic coupling of the harvesting circuit to the detune circuit.

3. The apparatus of claim 2, wherein the harvester further comprises:
   a harvester capacitor having a capacitance value; and
   a rectifier;
   wherein the harvesting inductor and the decoupling inductor operate as a transformer to harvest the energy from the harvester capacitor.

4. The apparatus of claim 3, wherein the harvester capacitor is an electronically tunable capacitor and the apparatus further includes at least one electronic processor configured to electronically tune the capacitance value of the harvester capacitor to tune a load impedance of the harvester.

5. The apparatus of claim 3, wherein the harvester further includes:
   a storage configured to store the harvested energy.

6. The apparatus of claim 5, wherein the harvested energy is retrieved from the storage to supply power to the RF coil.

7. The apparatus of claim 5, wherein the RF coil is a RF surface coil.

8. The method of claim 7, wherein the estimating includes:
   the processor applying the digital harvested energy signal to the look-up table to obtain an estimated magnetic field generated by the RF coil.

9. The method of claim 7, wherein the estimating includes:
   the processor applying the digital harvested energy signal to the fitted equation to obtain an estimated magnetic field generated by the RF coil.

10. The apparatus of claim 1, wherein the non-transitory computer readable medium further stores the look-up table, and the at least one electronic processor is programmed to estimate the magnetic field generated by the RF coil from the digital harvested energy signal by estimating the magnetic field from values in the look-up table.

11. The apparatus of claim 10, wherein the look-up table is generated by:
   determining a type of the RF coil and the capacitance value of the harvester capacitor;
   measuring the digital harvested energy signal for different known magnetic fields to generate magnetic field values; and
   generating the look-up table from the generated magnetic field values.

12. The apparatus of claim 1, wherein the non-transitory computer readable medium further stores the fitted equation, and the at least one electronic processor is programmed to estimate the magnetic field generated by the RF coil from the digital harvested energy signal by estimating the magnetic field from the fitted equation.

13. The apparatus of claim 12, wherein the fitted equation is generated by:
  determining a type of the RF coil and the capacitance value of the harvester capacitor;
  measuring the digital harvested energy signal for different known magnetic fields to generate magnetic field values; and
  generating the fitted equation from the generated magnetic field values.

14. The apparatus of claim 1, wherein the harvester is not galvanically connected with the detune circuit.

15. A method of harvesting energy from a magnetic resonance (MR) imaging device, the method comprising:
  coupling a detune circuit to a radiofrequency (RF) coil;
  magnetically coupling a harvesting inductor of a harvester with a decoupling inductor of the detune circuit;
  harvesting energy with the decoupling inductor digitizing, with an analog-to-digital (ADC) converter the harvested energy to generate a digital harvested energy signal; and
  estimating a magnetic field generated by the RF coil from the digital harvested energy signal using a processor configured to apply the digital harvested energy signal to at least one of a look-up table and a fitted equation.

16. The method of claim 15, wherein harvesting energy with the decoupling inductor includes:
  harvesting the energy from a harvester capacitor of the harvester.

17. The method of claim 16, further including:
  electronically tuning a capacitance value of the harvester capacitor to tune a load impedance of the harvester.

18. The method of claim 15, further including:
  supplying power to the RF coil with the harvested energy.

19. An apparatus for use in harvesting energy from a magnetic resonance (MR) imaging device, comprising:
  a radiofrequency (RF) coil;
  a detune circuit operatively coupled to the RF coil, wherein the detune circuit includes a decoupling inductor configured as a transmitter (TX) inductor; and
  a harvester magnetically coupled to the decoupling inductor for harvesting energy from the decoupling inductor, the harvester further including a harvester capacitor having a capacitance value and a harvesting inductor;
  an analog-to-digital (ADC) converter configured to digitize the harvested energy to generate a digital harvested energy signal;
  at least one electronic processor; and
  a non-transitory computer readable medium storing instructions executable by the at least one electronic processor, the instructions causing the at least one-processor to apply the digital harvested energy signal to at least one of a look-up table and a fitted equation to estimate a magnetic field generated by the RF coil,
  wherein the harvesting inductor and the decoupling inductor operate as a transformer to harvest the energy from the harvester capacitor.

* * * * *